United States Patent [19]
Gerosa

[11] Patent Number: 6,108,181
[45] Date of Patent: Aug. 22, 2000

[54] ELECTROSTATIC DISCHARGE (ESD) CIRCUIT

[75] Inventor: Gianfranco Gerosa, Austin, Tex.

[73] Assignee: Motorola Inc., Schaumburg, Ill.

[21] Appl. No.: 08/636,007

[22] Filed: Apr. 23, 1996

[51] Int. Cl.[7] ...................................................... H02H 9/00
[52] U.S. Cl. ................................ 361/56; 361/58; 361/111; 257/355
[58] Field of Search ................................. 361/56, 58, 91, 361/111; 257/355–358, 361, 362, 363, 589

[56] References Cited

U.S. PATENT DOCUMENTS

| | | | |
|---|---|---|---|
| 5,157,573 | 10/1992 | Lee et al. | 361/56 |
| 5,182,220 | 1/1993 | Ker et al. | 437/34 |
| 5,539,327 | 7/1996 | Shigehava et al. | 326/30 |
| 5,541,801 | 7/1996 | Lee et al. | 361/56 |
| 5,572,394 | 11/1996 | Ker et al. | 361/56 |

OTHER PUBLICATIONS

"Complementary–LVTSCR ESD Protection Circuit for Sub-micron CMOS VLSI/ULSI," Ker, et al., IEEE Transactions on Electron Devices, vol. 43, No. 4, Apr. 1996.

*Primary Examiner*—Jeffrey A. Gaffin
*Assistant Examiner*—Michael J. Sherry
*Attorney, Agent, or Firm*—Lee E. Chastain

[57] ABSTRACT

An electrostatic discharge (ESD) discharge circuit provides robust protection to an integrated circuit (13). In one embodiment, a resistive element (71) ensures that current shunting bipolar devices (60, 62, and 68) turn-on before devices within the integrated circuit are damaged by secondary breakdown. In another embodiment, a two terminal device (69) provides base current to a bipolar device (60) that shunts excess charge. This two terminal device enters gate aided junction breakdown as does an N-type MOSFET (72 and 74) but does not exhibit the same snap-back characteristics during ESD. Consequently, the two terminal device ensures that the ESD circuit tracks process modifications to the integrated circuit.

28 Claims, 5 Drawing Sheets

ELECTROSTATIC DISCHARGE (ESD) CIRCUIT

FIELD OF THE INVENTION

The present invention generally relates to electronic integrated circuits, and more specifically to an electrostatic discharge protection circuit for an integrated circuit.

BACKGROUND OF THE INVENTION

In the semiconductor industry, the use of electrostatic discharge protection (ESD) circuits is known. ESD circuits ensure that integrated semiconductor devices are not destroyed by static electricity during routine post-manufacture processes.

Figure 1:
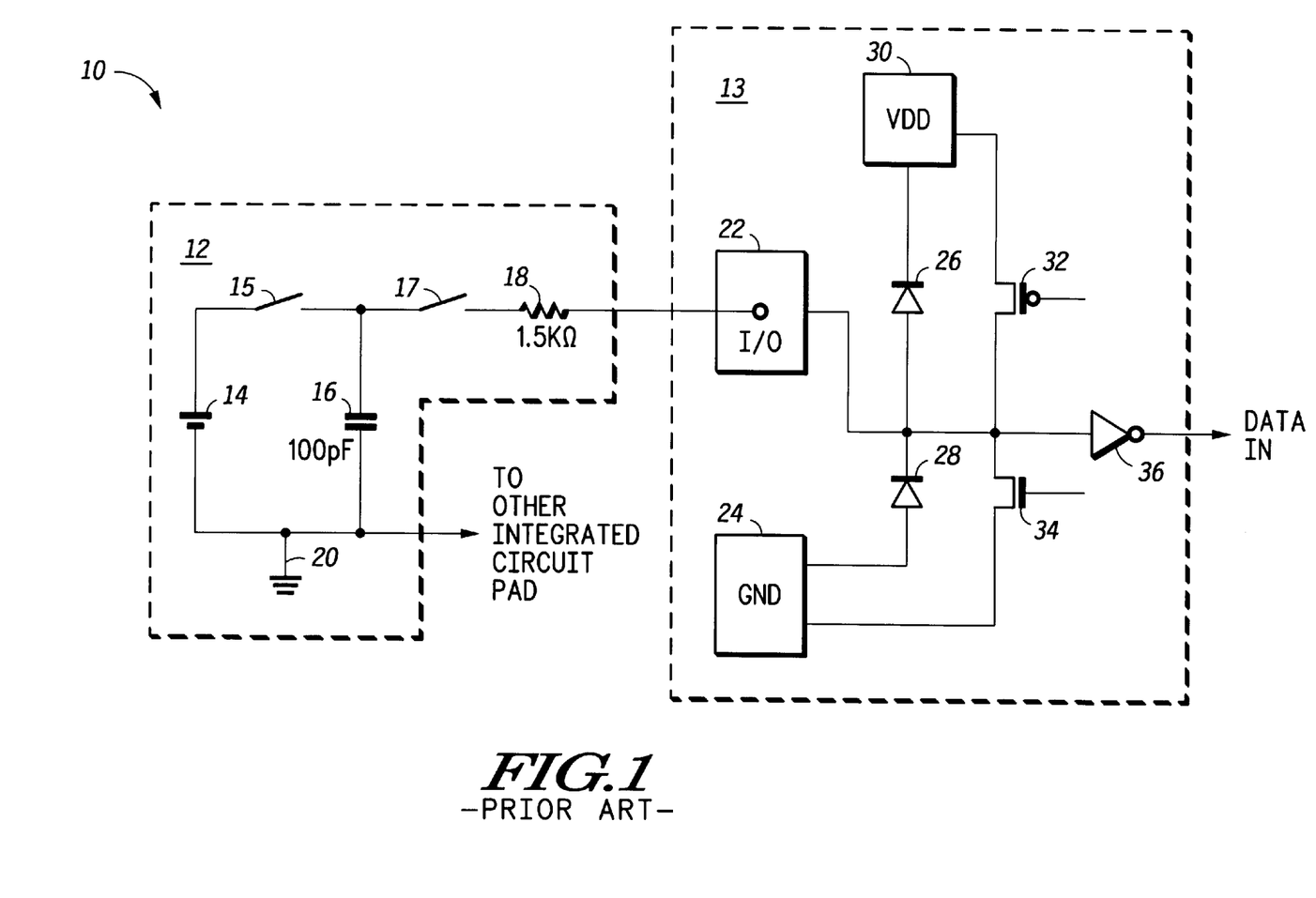
FIGS. 1–3 depict block diagrams of an electrical system, including an electrostatic discharge circuit, known in the art.

FIG. 1 depicts a prior art diagram of an electrical system 10. Electrical system 10 consists of a human body model tester 12 and an integrated circuit 13. Human body model tester 12 itself consists of a power supply 14, a capacitor 16, switches 15 and 17, a resistor 18, and a system ground 20. A first terminal of power supply 14 is connected to system ground 20. A second terminal of power supply 14 is connected to a first terminal of switch 15. A first terminal and a second terminal of capacitor 16 are coupled in to system ground 20 and to a second terminal of switch 15. A first terminal of switch 17 is connected to the second terminal of switch 15. A second terminal of switch 17 is connected to a first terminal of resistor 18. A second terminal of resistor 18 and system ground 20 are the two outputs of human body model tester 12.

Human body model tester 12 synthesizes the effects of a human body handling integrated circuit 13. After manufacture, it is possible for a person to pick up integrated circuit 13 by making a connection between any two pins on the integrated circuit with the person's hand. When this occurs, any static electricity built-up in the body will discharge through the part via the contacted pins. Human body model tester 12 models such a condition by asymmetrically opening and closing switches 15 and 17 while the two outputs of human body model tester 12 are connected to two pins of integrated circuit 13. In this way, an electric charge is stored in capacitor 16 and subsequently discharged to integrated circuit 13 through resistor 18. The amount of charge stored in capacitor 16 may be slowly increased to increase the output ESD until integrated circuit 13 fails or meets some predetermined criteria. In this way, human body model tester 12 can methodically determine the robustness of integrated circuit 13 to ESD.

Integrated circuit 13 consists of an I/O terminal 22, a low voltage supply GND 24, diodes 26 and 28, a high voltage supply VDD 30, a P-type transistor 32, an N-type transistor 34, and an input buffer 36. I/O terminal 22 is connected to a P-type terminal of diode 26 and an N-type terminal of diode 28. The N-type terminal of diode 26 is connected to voltage supply VDD 30. The P-type terminal of diode 28 is connected to voltage supply GND 24. A first current electrode and a second current electrode of transistor 32 are connected to I/O terminal 22 and to voltage supply 30, respectively. A first current electrode and a second current electrode of transistor 34 is connected to I/O terminal 22 and to voltage supply 24, respectively. An input of input buffer 36 is connected to I/O terminal 22. An output of input buffer 36 generates the data signal labeled in FIG. 1 DATA IN.

During normal operation, an input voltage is driven onto I/O terminal 22 to input buffer 36 by an external device (not shown) or an output voltage is driven off of I/O terminal 22 by one of transistors 32 and 34. In either case, the voltage on I/O terminal 22 would approximate either voltage supply GND 24 or voltage supply VDD 30. If a high signal were applied at I/O terminal 22, then diode 26 would not be forward biased nor would the breakdown voltage of diode 28 be exceeded. Therefore, no "leakage" current would flow through diodes 26 and 28. Conversely, if a low signal were applied to I/O terminal 22, then neither of diodes 26 or 28 would be forward biased. Again, diodes 26 and 28 would not leak current during normal operation.

During an ESD event, voltages significantly higher than the difference between voltage supply VDD 30 and voltage supply GND 24 are applied to the inputs of integrated circuit 13. For example, when a large positive voltage is applied between I/O terminal 22 and voltage supply VDD 30, diode 26 becomes strongly forward biased and current will flow from I/O terminal 22 through diode 26 to voltage supply VDD 30. Excessive charge is thereby diverted from transistors 32 and 34 and from input buffer 36. Conversely, a large negative charge may be applied between I/O terminal 22 and voltage supply GND 24. In this case, diode 28 becomes strongly forward biased and current will flow from voltage supply GND 24 through diode 28 to I/O terminal 22. Excessive charge is again diverted.

Although the ESD protection provided by diodes 26 and 28 is effective, integrated circuit 13 is not tolerant of inputs greater than one diode drop above voltage supply VDD 30. Typically, it is advantageous for integrated circuit 13 to operate at a certain low voltage, e.g. 3.3 volts, yet tolerate input signals of a higher level, e.g. 5 volts. If such an input were applied to I/O terminal 22, then leakage current would flow from through diode 26 as diode 26 attempted to clamp I/O terminal 22 at one diode drop above voltage supply VDD 30. This leakage current would be unacceptable. Also, transistors 32 and, especially, 34 might be damaged by the application of 5 volts between their first current electrodes and their control electrodes.

Figure 2:
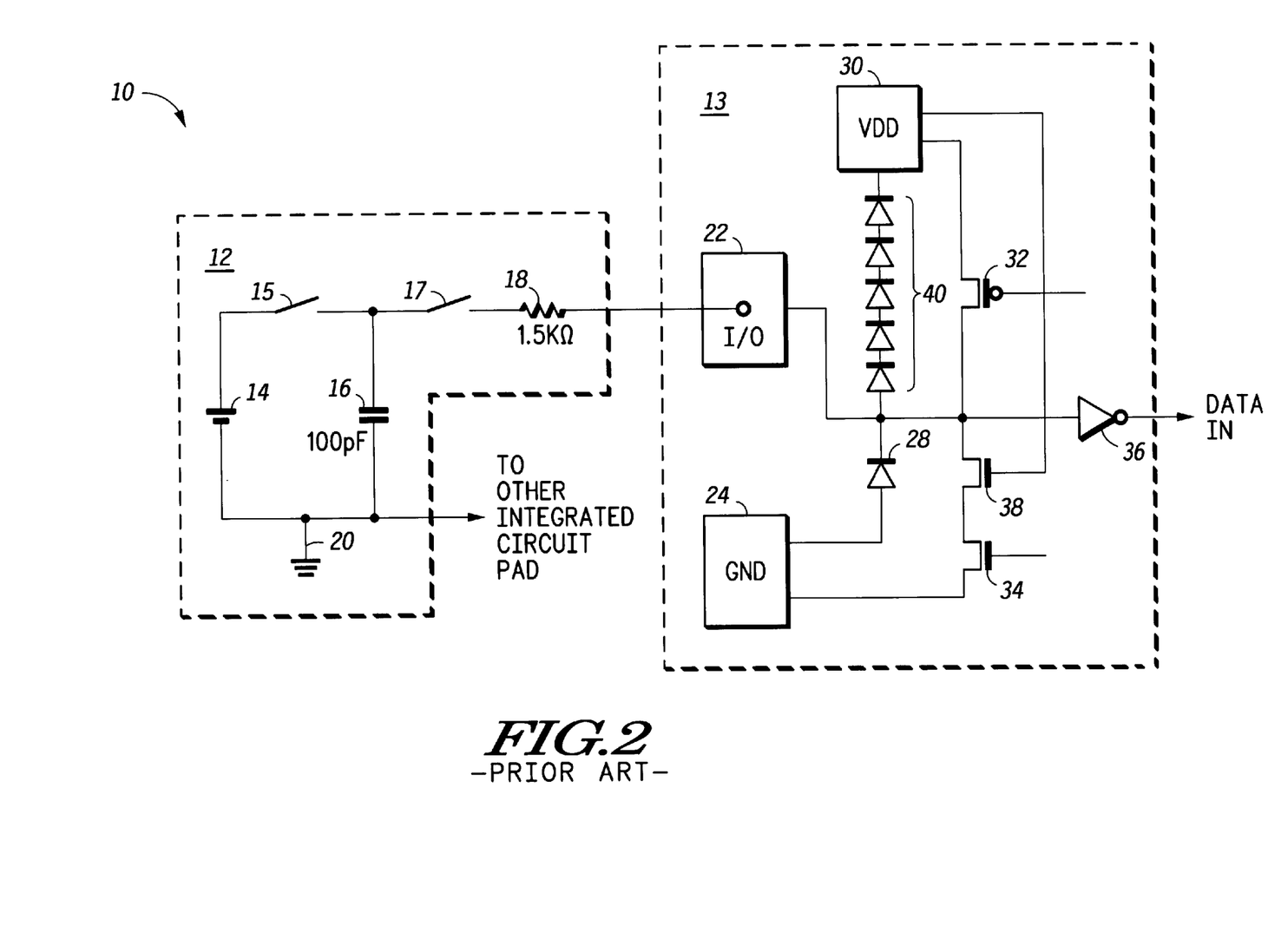

Prior art FIG. 2 illustrates a second embodiment of electrical system 10 having a human body model tester 12 and an integrated circuit 13. The human body model tester 12 is identical to that of FIG. 1 and will not be discussed further. Here, a diode string 40 of five diodes replaces diode 26. A N-terminal of diode string 40 is connected to voltage supply VDD 30. A P-terminal of diode string 40 is connected to I/O terminal 22. An N-type transistor 38 is also coupled in series between I/O terminal 22 and the first current electrode of transistor 38. A control electrode of transistor 38 is connected to voltage supply VDD 30.

During normal operation, an input voltage larger than voltage supply VDD 30 can be applied to I/O terminal 22. Such a configuration allows for integrated circuits requiring different power supplies to be connected together directly. Diode string 40 will not leak current until the input voltage is 5 diode drops above voltage supply VDD 30. Typically, this difference is sufficient to make a 3.3 volt device 5 volt tolerant. Transistor 38 ensures that the 5 volt signal received at I/O terminal 22 is not directly seen by transistor 34. (In the depicted embodiment, N-type transistor 34 is less robust than P-type transistor 32.) In particular, the maximum voltage difference across the first current electrode and control electrode of transistor 38 is 1.7 volts (5−3.3). Continuing away from I/O terminal 22, the voltage output by the second current electrode of transistor 38 is the one threshold voltage less than the voltage applied to the control electrode of transistor 38, approximately 2.8 volts. Consequently, the maximum voltage difference across the first current electrode and control electrode of transistor 34 is 2.8 volts (2.8−0). All of these voltages are tolerable within 3.3 volt devices.

During an ESD event, diode string 40 operates as does diode 26 depicted in FIG. 1, becoming forward biased when a voltage larger than voltage supply VDD 30 plus five diode drops is applied to I/O terminal 22. Diode string 40 can then shunt charge excessive charge from input buffer 36 and transistors 32, 34, and 38.

Unfortunately, diode chain 40 also behaves like a Darlington chain of parasitic bipolar transistors during normal operation. In a Darlington chain, the gain or β of each transistor amplifies the leakage current of the previous transistor. As a result, diode string 40 will be characterized by a large leakage current unless β is very small. The gain or β of a transistor is dependent upon process used to manufacture integrated circuit 13 and may be difficult to control.

Figure 3:
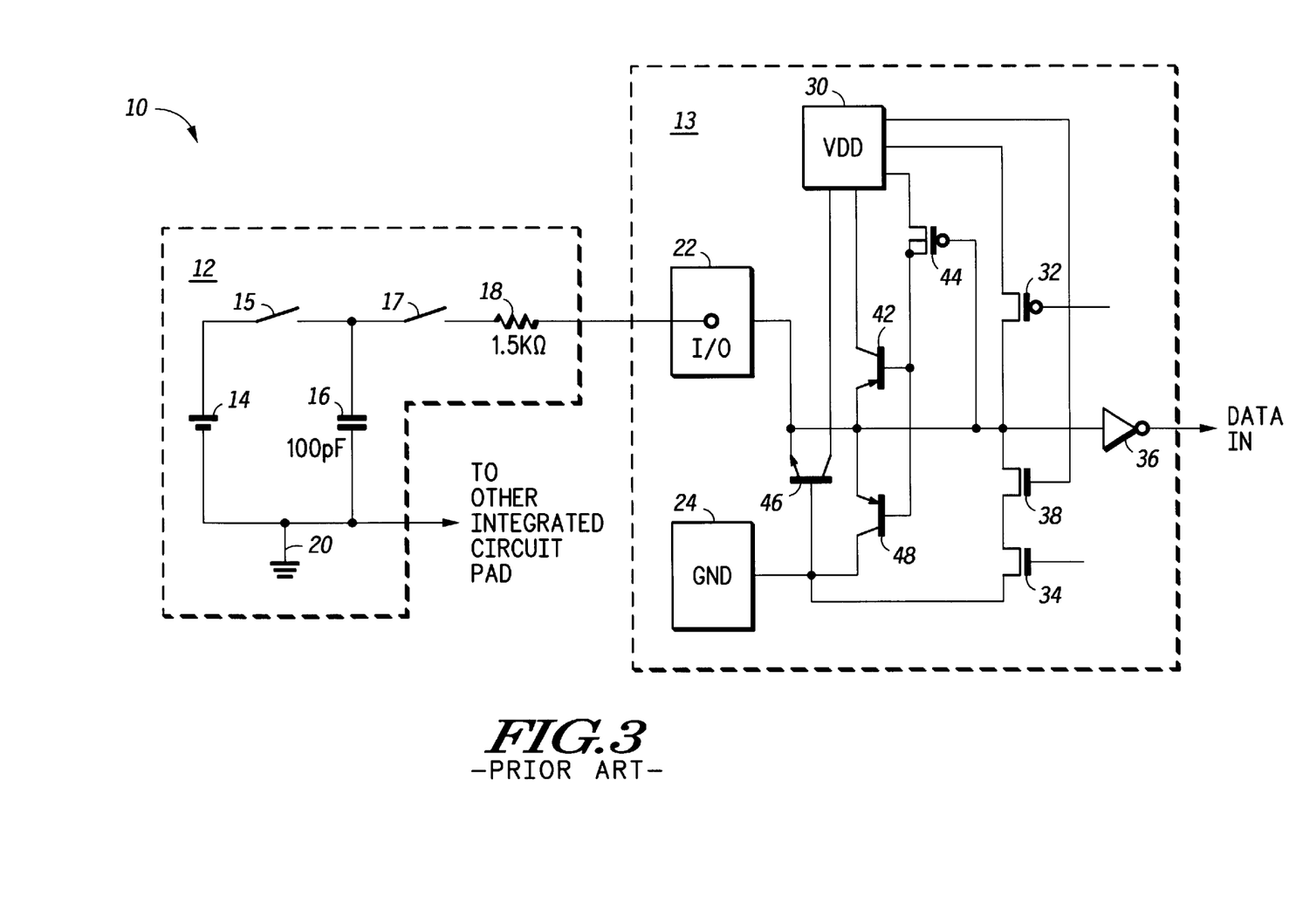

Prior art FIG. 3 illustrates a third embodiment of electrical system 10. Human body model tester 12 is the same as in prior art FIG. 1. Integrated circuit 13 comprises a PNP transistor 42, a P-type transistor 44, an NPN transistor 46, and a PNP transistor 48 in place of diodes 26 and 28 (depicted in FIG. 1). A first current electrode and a second current electrode of transistor 42 are connected to I/O terminal 22 and to voltage supply 30, respectively. A first current electrode, a second current electrode, and a control electrode of transistor 44 are connected to the control electrode of transistor 42, to voltage supply VDD 30, and to I/O terminal 22, respectively. A first current electrode, a second current electrode, and a control electrode of transistor 46 are connected to I/O terminal 22, to the voltage supply VDD 30, and to voltage supply GND 24, respectively. A first current electrode, a second current electrode, and a control electrode of transistor 48 are connected to I/O terminal 22, to voltage supply GND 24, and to the control electrode of transistor 42, respectively.

During normal operation, either a 5 or 0 volt input would be applied to I/O terminal 22. A 5 volt input would turn-off transistor 44, allowing the control electrodes of transistors 42 and 48 to follow the input voltage less one diode drop. A 0 volt input would turn-on transistor 44 thereby applying voltage supply VDD 30 to the control electrodes of transistors 42 and 48. In this case, these transistors would be in a non-conducting state. In either case, integrated circuit 13 would generate little or no leakage current during normal operation.

During an ESD event, either a large positive or a large negative charge is applied to I/O terminal 22 with respect to voltage supply GND 24 or with respect to voltage supply VDD 30. In the case of a large positive input, transistor 44 is turned-off, allowing the control electrodes of transistors 42 and 48 to follow the input voltage less one diode drop. However, transistor 44 will enter into gate aided junction breakdown because of the large voltage difference between its control electrode and voltage supply VDD 30. In gate aided junction breakdown, current flows from the current electrode to (or from) the silicon below the control electrode of the transistor. Here, the silicon below the control electrode of transistor 44 is an N-well which is also the control electrode of PNP transistors 42 and 48. This current becomes the base current of transistor 42 if the ESD event is with respect to I/O terminal 22 and voltage supply VDD 30. Or, this current becomes the base current of transistor 48 if the ESD event is with respect to I/O terminal 22 and voltage supply GND 24. Transistors 42 and 48 amplify the base current applied to them by their respective gains or β's. This current then shunts the excessive charge to the appropriate voltage supply. In the case of a large negative input, transistor 46 becomes forward biased with respect to one voltage supply. If the ESD event is with respect to I/O terminal 22 and voltage supply GND 24, then excess charge flows from voltage supply GND 24 through the control electrode and the first current electrode of transistor 46 to I/O terminal 22. If the ESD event is with respect to I/O terminal 22 and voltage supply VDD 30, then excess charge flows from voltage supply VDD 30 through the inherent capacitance of integrated circuit 13 to voltage supply GND 24 and then out through I/O terminal 22.

The ESD protection afforded by integrated circuit 13 depends in large part upon transistor 44 entering gate aided junction breakdown near or prior to transistors 32, 34, or 38 entering into gate aided junction breakdown. As described above, the current generated by transistor 44 becomes the base current for transistors 42 and 48. If transistors 32, 34, or 38 enter gate aided junction breakdown first, then they may continue into secondary breakdown before transistor 44 begins supplying base current to transistors 42 and 48. In secondary breakdown, excessive current flows through a transistor heats it, melts it, and permanently impairs its ability to function. In the embodiment depicted in FIG. 3, transistor 44 will begin supplying drive current at approximately the same time as transistor 32 enters into gate aided junction breakdown, the voltage "BVDSSP." These transistors are the same conductivity type and, hence, behave identically. Transistor 44 is not the same conductivity type as transistors 34 and 38. Transistors 34 and 38 enter gate aided junction breakdown at the voltage "BVDSSN." Therefore, the ESD circuit depicted here will only protect integrated circuit 13 if BVDSSP is less than BVDSSN. Unfortunately, the relationship between BVDSSN and BVDSSP is process dependent. Therefore, each new instantiation of integrated circuit 13 may require a different ESD circuit. This requirement can become difficult to bare as integrated circuit 13 is reduced in size, or is otherwise manufactured according to a new process recipe.

SUMMARY OF THE INVENTION

In accordance with the present invention, an electrostatic discharge protection (ESD) device is disclosed which substantially eliminates disadvantages known in the art.

In one embodiment, three transistors and an impedance device form the ESD device. Two of the transistors are connected in series between two voltage supplies and an input node. The third transistor supplies current to the control electrodes of the other two transistors. The impedance device is also connected to the input node.

In another embodiment, the two transistors are bipolar transistors and the third transistor is a p-type MOSFET. The p-type MOSFET therefore supplies base current to the two bipolar transistors.

DETAILED DESCRIPTION OF THE INVENTION

Figure 4:
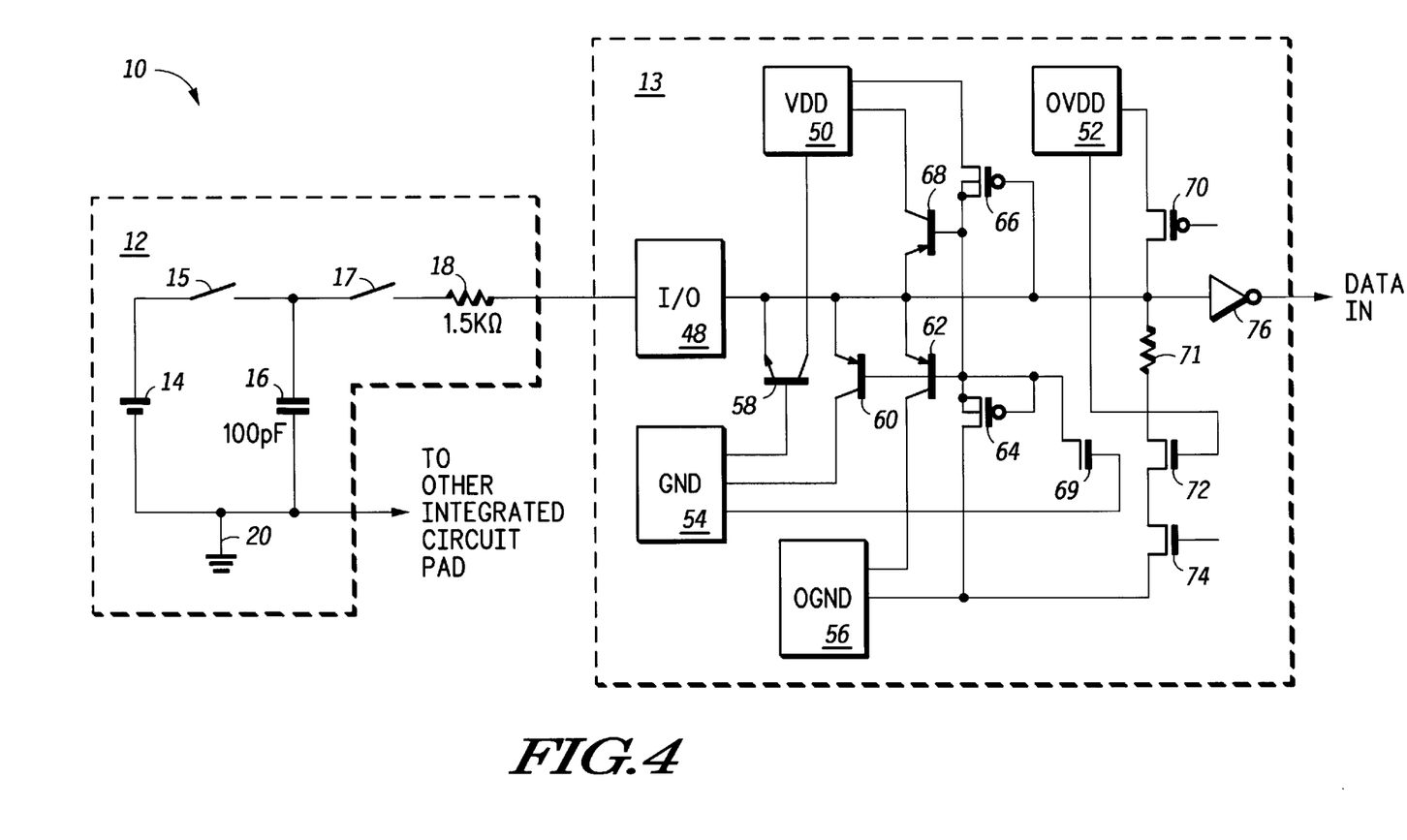
FIG. 4 depicts a block diagram of an electrical system, including an electrostatic discharge circuit constructed according to the present invention.

FIG. 4 depicts a block diagram of an electrical system, including an electrostatic discharge circuit constructed according to the present invention. Integrated circuit 13 contains an electrostatic discharge (ESD) protection circuit that has numerous advantages over the prior art. First, the electrostatic discharge circuit operates with a voltage potential of 3.3 volts between its two voltage supplies. However, integrated circuit 13 may receive input signals from another device (not depicted) that operates with a voltage difference of 5 volts between its voltage supplies. Second, integrated circuit 13 does not contain a Darlington string of parasitic bipolar transistors similar to that found in the prior art. Therefore, the electrostatic discharge circuit of integrated circuit 13 has a low current leakage characteristic when operating normally. Consequently, integrated circuit 13 consumes less power than prior solutions. This consequence makes integrated circuit 13 more suitable for low power- or heat-sensitive applications. Third, the electrostatic discharge circuit of integrated circuit 13 scales or tracks those changes made to integrated circuit 13 as a result of process or geometry changes. This consequence minimizes the amount of re-engineering required each time integrated circuit 13 is fabricated from a different process or is otherwise geometrically shrunk to produce a smaller integrated circuit size. Fourth, the electrostatic discharge circuit incorporated into integrated circuit 13 provides electrostatic discharge protection complying with the human body model. This consequence makes integrated circuit 13 a more robust part with respect to all post manufacture processes.

A human body model tester 12 is connected to integrated circuit 13. Human body model tester 12 is described above in connection with FIG. 1 and will not be described further. Within integrated circuit 13, an input/output (I/O) terminal 48 receives an input signal to and/or outputs an output signal from integrated circuit 13. For purposes of understanding the present invention, I/O terminal 48 may be considered to be a node to which electrostatic discharge circuit, I/O drivers and I/O receivers are connected. Integrated circuit 13 contains four separate voltage supplies: a high internal voltage supply VDD 50, an output high voltage supply OVDD 52, a low internal voltage supply GND 54, and an output low voltage supply OGND 56. Voltage supply VDD 50 and voltage supply GND 54 supply power for the internal portions of integrated circuit 13. Voltage supply OVDD 52 and voltage supply OGND 56 power the output drivers on integrated circuit 13. This bifurcation of power supplies reduces the transmission of noise generated by the large output drivers to other circuits within integrated circuit 13.

A first current electrode, a second current electrode and a control electrode of an NPN lateral bipolar transistor 58 are coupled to I/O terminal 48, voltage supply VDD 50 and voltage supply GND 54, respectively. A first current electrode and a second current electrode of a PNP vertical bipolar transistor 60 are coupled to I/O terminal 48 and to voltage supply GND 54, respectively. A first current electrode and a second current electrode of a PNP lateral bipolar transistor 62 are coupled to I/O terminal 48 and to the voltage supply OGND 56. A first current electrode and a control electrode of a P-type transistor 64 are coupled to each other and to the control electrodes of transistors 60 and 62. A second current electrode of transistor 64 is coupled to the voltage supply OGND 56. A first current electrode, a second current electrode and a control electrode of a P-type transistor 66 are coupled to the voltage supply VDD 50, the first current electrode of transistor 64 and to I/O terminal 48, respectively. The second current electrode of transistor 66 is also coupled to a control electrode of a PNP lateral bipolar transistor 68. A first current electrode and a second current electrode of transistor 68 are coupled to the voltage supply VDD 50 and to I/O terminal 48, respectively. A first terminal of a two-terminal device 69 is also coupled to the first current electrode of transistor 64. The second terminal of device 69 is coupled to the voltage supply GND 54. Two-terminal device 69 is further described in connection with FIG. 6 below.

Integrated circuit 13 also comprises a P-type transistor 70, a resistor 71, an N-type transistor 72, an N-type transistor 74 and an input buffer 76. These elements are used to send data to I/O terminal 48 or to receive data from I/O terminal 48. In particular, a first current electrode and a second current electrode of transistor 70 are coupled to voltage supply OVDD and to I/O terminal 48, respectively. A first terminal and a second terminal of resistor 71 are coupled to I/O terminal 48 and to a first current electrode of transistor 72, respectively. A second current electrode of transistor 72 is coupled to a first current electrode of transistor 74. Finally, a second current electrode of transistor 74 is coupled to the voltage supply OGND 56. A control electrode of transistor 72 is connected to voltage supply OVDD 52. An input to input buffer 76 is coupled to I/O terminal 48. As depicted, the control electrodes of transistors 70 and 74 and an output of input buffer 76 are open indicating their connection to other components of integrated circuit 13 not depicted nor relevant to the present invention.

Transistors 58, 60, 62, 64, 66, and 68, two-terminal device 69 and resistor 71 perform electrostatic discharge features of the present invention and are generally referred to herein as the electrostatic discharge circuit.

The two control electrodes of NPN lateral bipolar transistor 58 are formed by making ohmic contacts to two adjacent N-wells formed in a P-substrate. The P-substrate, acting as the control electrode, is connected to voltage supply GND 54. A first current electrode of PNP vertical bipolar transistor 60 is formed by diffusing a P-junction into an N-well which itself is formed in a P-substrate. Again, the P-substrate is connected to voltage supply GND 54 to act as the second current electrode. The N-well acts as the control electrode. Ultimately, the N-well is connected by an ohmic contact to a diffused P-junction that forms the first current electrode of transistor 66. The two control electrodes of PNP lateral bipolar transistors 62 and 68 are each formed by diffusing two P-junctions into an N-well. One P-junction of each of transistors 62 and 68 is connected to I/O terminal 48. The second diffused P-region of transistor 62 is connected to the voltage supply OGND 56. The second diffused P-region of transistor 68 is connected to the voltage supply VDD 50. In one embodiment of the invention, transistors 60, 62, 64, 66, and 68 are fabricated in the same N-well. P-type transistor 64, 66, and 70, and N-type transistor 72 and 74 are conformed by conventional metal oxide semiconductor (MOS) processes. Two terminal device 69 is described below in connection with FIG. 6. Resistor 71 is formed using the natural resistance of an N-well formed in a P-substrate.

The operation of integrated circuit 13 may be conveniently described with reference to two modes of operation: (1) normal I/O operation, and (2) electrostatic discharge function. The electrostatic discharge function may be further divided into four cases paralleling the four methods used to test the human body model: (1) positive input voltage with respect to VDD or OVDD, (2) positive input voltage with respect to GND or OGND, (3) negative input voltage with respect to VDD or OVDD, and (4) negative input voltage with respect to GND or OGND.

In normal I/O operation, an input voltage is either output by I/O terminal 48 via a control signal applied to transistors 70 or 74 or is input to input buffer 76 via I/O terminal 48. In the first case, an active control signal generated elsewhere in integrated circuit 13 is applied to the control electrode of transistor 70 or to the control electrode of transistor 74, but not both. Depending upon which transistor is enabled, either voltage supply OVDD 52 or voltage supply OGND 56 will be coupled to I/O terminal 48. In the second case, a voltage generated external to integrated circuit 13 is applied to I/O terminal 48 and buffered by input buffer 76. The output of input buffer 76 is used elsewhere in integrated circuit 13.

As described above, integrated circuit 13 is 5 volt tolerant. If a 5 volt signal is applied to I/O terminal 48, no damage will occur to either transistor 70 or to transistor 74. The control electrode and the well of transistor 70 are both biased by circuitry (not shown) known in the art to insure that transistor 70 does not conduct current when a voltage greater than voltage supply OVDD 52 is applied to I/O terminal 48. In the case of transistor 74, transistor 72 ensures that the voltages between the first current electrode and the control electrode or the first current electrode and the second current electrode of transistor 74 does not exceed the voltage supply OVDD 52.

Also, integrated circuit 13 generates little leakage current making it suitable for power- and heat-sensitive applications. Here, a high input signal on I/O terminal 48 will turn-off transistor 66 allowing the control electrode of transistors 60, 62, and 68 to follow the input signal less one diode drop. Conversely, a low input signal on I/O terminal 48 will reverse-bias the control electrodes of transistors 60, 62, and 68. In both cases, little or no leakage current will be generated.

ESD EVENTS
Positive Voltage Input With Respect to VDD or OVDD

In this case, a large positive voltage level is applied to I/O terminal 48 and either voltage supply VDD 50 or voltage supply OVDD 52 is connected to system ground 20. The large positive input voltage turns-off transistor 66 allowing the base of transistor 60 and 68 to follow the high input voltage less one diode drop. Eventually, the large input voltage at the control electrode and at the first current electrode of transistor 68 will force transistor 66 to enter into gate aided junction breakdown. This phenomenon will cause a current to flow from one current electrode to the other current electrode of transistor 66, generating a base current at the control electrode of transistor 68, primarily, and at the control electrode of transistor 60, secondarily. The gain of transistors 68 and 60 will magnify this base current by a factor of each transistor's β. The large input voltage is thereby shunted from I/O terminal 48 to system ground 20 via voltage supply VDD 50 and voltage supply GND 54. It should be noted that the inherent chip capacitance of integrated circuit 13 connects voltage level GND 54 and voltage level VDD 50. If the voltage level OVDD 52 is instead connected to system ground 20, current flows from voltage level VDD 50 through a diode (not shown) to voltage level OVDD 52. This diode is what separates the two positive voltage supplies.

Positive Voltage Input With Respect to GND or OGND

In this case, a large positive voltage level is applied to I/O terminal 48 and either voltage level GND 54 or voltage level OGND 56 is connected to system ground 20. Again, transistor 66 is turned off, allowing the control electrodes of transistors 60 and 68 to follow the high input voltage less one diode drop. Eventually, the large input voltage level forces two-terminal device 69 to enter into gate aided junction breakdown. This phenomenon will cause a current to flow from the one current electrode to the N-well of two terminal device 69, generating a base current at the control electrodes of transistor 60, primarily, and at the control electrode of transistor 68, secondarily. Again, the gain of transistors 60 and 68 magnifies this current. The large input voltage is thereby shunted to the voltage level GND 54 via transistors 60 and 68. The inherent chip capacity of integrated circuit 13 again couples voltage level VDD 50 to voltage level GND 54. If the voltage level OGND 56 is instead coupled to system ground 20, then a voltage difference across the current electrodes of transistor 64 causes transistor 64 to enter into gate aided junction breakdown. This phenomenon generates base current for transistor 62, thereby shunting the large input voltage from I/O terminal 48 to the voltage supply OGND 56.

Negative Input Voltage With Respect to VDD or OVDD

Here, a large negative voltage level is applied to input I/O terminal 48 and either the voltage level VDD 50 or the voltage level OVDD 52 is connected to system ground 20. In the case of connection to voltage supply VDD 50, the inherent chip capacity of integrated circuit 13 couples voltage level VDD 50 to voltage level GND 54 and ultimately to the control electrode of transistor 58. In the case of voltage supply OVDD 52, the inherent chip capacity of integrated circuit 13 and a diode (not shown) couples voltage level OVDD 52 to voltage supply VDD 50, to voltage level GND 54 and ultimately to the control electrode of transistor 58. In both cases, transistor 58 is forward biased, causing current to flow from voltage level VDD 50 through transistor 58 and out to I/O terminal 48. As described above, the voltage level OVDD 52 is connected to the voltage level VDD 50 by a diode. Current can then flow from voltage supply OVDD 52 through transistor 58 and out to I/O terminal 48 when system ground 20 is coupled to voltage supply OVDD 52.

Negative Voltage Input With Respect to GND or OGND

In this case, a large negative voltage is applied to I/O terminal 48 and either voltage level GND 54 or voltage level OGND 56 is connected to system ground 20. In the case in which system ground 20 is coupled to the voltage level GND 54, transistor 58 is forwarded biased, thereby creating a direct current path from voltage supply GND 54 to I/O terminal 48. In the second case, voltage supply OGND 56 is coupled to system ground 20 by a diode (not shown). Here, transistor 58 creates the same ESD current path from voltage supply OGND 56 to I/O terminal 48.

Figure 5:
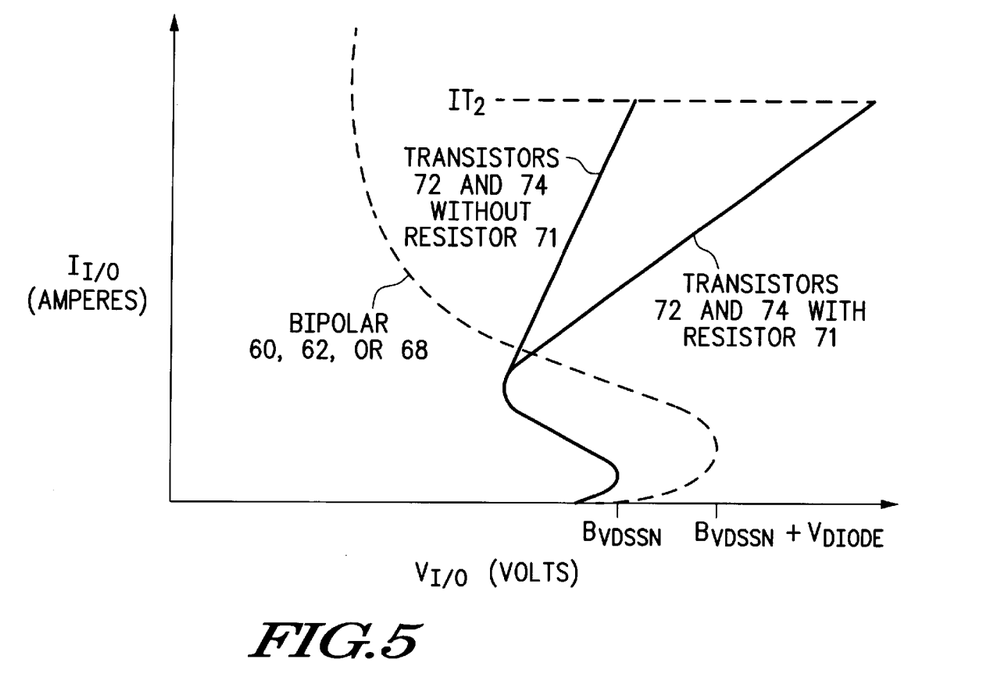
FIG. 5 depicts in graphical form, one operating characteristic of several elements depicted in FIG. 4.

FIG. 5 depicts in graphical form, one operating characteristic of several elements depicted in FIG. 4. FIG. 5 is helpful to explain certain advantages of the disclosed invention and the operation of resistor 71. As described above, the ESD protection of the present invention has the advantage of tracking process changes made to integrated circuit 13. In particular, as processes are modified and especially as minimum features are decreased, the voltage at which transistors 70, 72, and 74 enter into gate aided junction breakdown (BVDSSN and BVDSSP, depending upon device type) are strongly process dependent. In the particular embodiment, N-type transistors 72 and 74 break down earlier than P-type transistor 70. In other processes, the reverse may be true. Therefore, it is desirable to have an electrostatic protection circuit that is independent of the breakdown voltages of transistors 70, 72, and 74. According to the present invention, as P-type transistor 70 shrinks and its breakdown voltage BVDSSP decreases, so does the breakdown voltage of transistors 66 and 64. Similarly, as the breakdown voltage BVDSSN of N-type transistors 72 and 74 decreases, so does the breakdown voltage of two-terminal device 69. In this manner, transistors 64 and 66 and two terminal device 69 will enter gate aided breakdown junction approximately one diode drop after transistors 70, 72, or 74 enter gate aided junction breakdown.

The current sunk by transistors 72, or 74 without any ESD protection as a function of the control electrode to current electrode voltage is depicted by the solid line in FIG. 5. The current shunted by bipolar transistors 60, 62, or 68 when supplied with base current from transistor 64 and 66 or two terminal device 69 as a function of the control electrode to current electrode voltage is depicted by the dashed line. The gate aided junction breakdown of transistors 64 and 66 and two terminal device 69 generates base current for transistors 60, 62 and 68, thereby clamping the voltage on I/O terminal 48 at a safe level.

Resistor 71, depicted in FIG. 4, changes the I-V characteristics of transistor 72. This change increases the voltage at which point transistors 72 and 74 enter secondary breakdown, depicted as $IT_2$. Beyond $IT_2$, transistors 72 and 74 will be permanently damaged. This phenomenon is commonly referred to as "secondary breakdown." Resistor 71 provides an additional safety margin in which transistors 60, 62, and 68 can be assured to turn on fully before transistor 70, 72 or 74 enter into secondary breakdown. In some embodiments of the present invention, resistor 71 may not be necessary. In one embodiment of the described invention, resistor 71 has the value of 20 Ohms for a 0.5 micron complementary metal oxide semiconductor (CMOS) process. This resistivity will vary depending upon the process used to manufacture integrated circuit 13.

Figure 6:
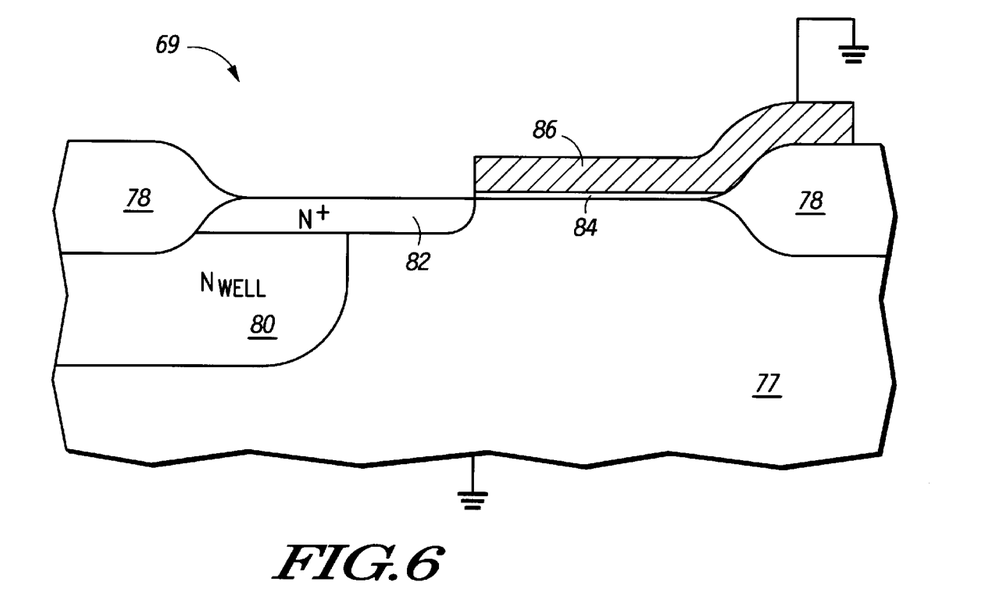
FIG. 6 depicts a cross-sectional view of the two-terminal device depicted in FIG. 4.

FIG. 6 depicts a cross-sectional view of the two-terminal device depicted in FIG. 4. Two terminal device 69 is formed in a P-type substrate 77 between two field oxide regions 78. A first terminal of two-terminal device 69 is an N-well 80 connected by an ohmic contact to the control electrodes of transistors 64 and 66 (not shown). An N+ region 82 is formed in N-well 80 extending outwardly therefrom and into P-substrate 77. A gate dielectric is formed above P-substrate 77 adjacent to N+ region 82. Ultimately, a gate or control electrode is formed on top of gate dielectric 84 for connection to voltage supply GND 54 (depicted in FIG. 4). As described above, two terminal device 69 mirrors the operation of N-type transistors 72 and 74 during gate aided junction breakdown. In this phenomenon, a high electric field is generated with in the immediate vicinity of N+ region 82 and gate electrode 86. This high electric field causes electrons to flow from P-substrate 77 to N+ region 82 in an uncontrolled manner. This flow of electrons forms the base current to transistors 60, 62 and 68 (depicted in FIG. 4).

A diode would not enter into gate aided junction breakdown as would two terminal device 69 or transistors 72 and 74. A diode will breakdown when the electric field between an N-well and a P-substrate or between a diffused N–region and a P-well exceeds a certain threshold. Typically, such a threshold is different from the threshold associated with gate aided junction breakdown. Therefore, two-terminal device 69 is a superior solution to a diode. Also, two-terminal device 69 is a superior solution to a full N-type metal oxide semiconductor field effect transistor (MOSFET). In this hypothetical solution, the N-type transistor would exhibit the same properties as N-type transistors 72 and 74 including the bipolar-like "snapback" feature after gate aided junction breakdown. This phenomenon is enabled by the existence of a second N+ region acting as the second current electrode of the transistor. As depicted in FIG. 6, two terminal device 69 has but a single N+ region 82.

Although the present invention has been described with reference to a specific embodiment, further modifications and improvements will occur to those skilled in the art. For instance, the disclosed invention is described with respect to a particular set of transistor conductivity types. One skilled, in the art, with the above description may change conductivity types under certain circumstances to tailor the invention to a particular process or embodiment. Also, resistor 71 is described as a portion of an N-well. One skilled in the art may substitute other structures to accomplish the same purpose. It is to be understood therefore, that the invention encompasses all such modifications that do not depart from the spirit and scope of the invention as defined in the appended claims.

What is claimed is:

1. An electrostatic discharge (ESD) circuit for receiving a voltage at a node, the electrostatic discharge circuit integrated into an integrated circuit, the integrated circuit protected from ESD events by the ESD circuit, the electrostatic discharge circuit comprising:

a first transistor further comprising a first current electrode, a second current electrode, and a control electrode, the first current electrode thereof coupled to receive a first voltage level, the second current electrode thereof coupled to the node;

a second transistor further comprising a first current electrode, a second current electrode, and a control electrode, the second current electrode thereof coupled to the control electrode of the first transistor, the control electrode thereof coupled to the node;

a third transistor further comprising a first current electrode, a second current electrode, and a control electrode, the first current electrode thereof coupled to the node, the second current electrode thereof coupled to receive a second voltage level, the control electrode thereof coupled to the control electrode of the first transistor; and an impedance device further comprising a first terminal and a second terminal, the first terminal thereof coupled to the node, the second terminal coupled to the integrated circuit to be protected.

2. The electrostatic discharge circuit of claim 1 further comprising a two terminal integrated device further comprising a first electrode and a second electrode, the first electrode thereof coupled to the control electrode of the first transistor, the second electrode thereof coupled to receive the second voltage level, the two terminal integrated device entering gate aided junction breakdown mode at approximately an equivalent voltage level as a first type of transistor.

3. The electrostatic discharge circuit of claim 2 further comprising:

a fourth transistor further comprising a first current electrode, a second current electrode, and a control electrode, the first current electrode thereof coupled to the node, the second current electrode thereof coupled to receive a third voltage level, the control electrode thereof coupled to the control electrode of the first transistor; and a fifth transistor further comprising a first current electrode, a second current electrode, and a control electrode, the first current electrode and control electrode thereof coupled to the control electrode of the first transistor, the second current electrode coupled to receive the third voltage level.

4. The electrostatic discharge circuit of claim 3 further comprising a sixth transistor further comprising a first current electrode, a second current electrode, and a control electrode, the first current electrode thereof coupled to the node, the second current electrode thereof coupled to receive the first voltage level.

5. The electrostatic discharge circuit of claim 1 further comprising:
   a fourth transistor further comprising a first current electrode, a second current electrode, and a control electrode, the first current electrode thereof coupled to the node, the second current electrode thereof coupled to receive a third voltage level, the control electrode thereof coupled to the control electrode of the first transistor; and
   a fifth transistor further comprising a first current electrode, a second current electrode, and a control electrode, the first current electrode and control electrode thereof coupled to the control electrode of the first transistor, the second current electrode coupled to receive the third voltage level.

6. An electrostatic discharge (ESD) circuit for an integrated circuit, the electrostatic discharge (ESD) circuit comprising:
   a data terminal of the integrated circuit;
   a first bipolar transistor coupled to provide current between the data terminal and a first ground terminal of the integrated circuit, the first bipolar transistor comprising a control electrode;
   a second bipolar transistor coupled to provide current between the data terminal and a first power supply terminal, the second bipolar transistor comprising a control electrode;
   a first P-type transistor comprising a first current electrode coupled to the control electrode of the first bipolar transistor and the control electrode of the second bipolar transistor, a second current electrode coupled to the first power supply terminal, and a gate electrode coupled to the data terminal of the integrated circuit; and
   a resistive element coupled between the data terminal and circuitry internal to the integrated circuit.

7. The electrostatic discharge (ESD) circuit of claim 6 wherein the circuitry internal to the integrated circuit is an output driver circuit.

8. The electrostatic discharge (ESD) circuit of claim 7 wherein circuitry internal to the integrated circuit includes an input driver circuit.

9. The electrostatic discharge (ESD) circuit of claim 6 wherein circuitry internal to the integrated circuit is an input driver circuit.

10. The electrostatic discharge (ESD) circuit of claim 6 further comprising:
    an electrical device comprising a doped semiconductive region coupled to the control electrode of the first bipolar transistor and the control electrode of the second bipolar transistor and a gate electrode coupled to the first ground terminal.

11. The electrostatic discharge (ESD) circuit of claim 10 further comprising:
    a second P-type transistor comprising a first current electrode coupled to the control electrode of the first bipolar transistor and the control electrode of the second bipolar transistor, a second current electrode coupled to a second ground terminal of the integrated circuit, and a gate electrode coupled to the first current electrode of the second P-type transistor.

12. The electrostatic discharge (ESD) circuit of claim 11 further comprising:
    a third bipolar transistor coupled to provide current between the data terminal and the second ground terminal of the integrated circuit, the third bipolar transistor comprising a control electrode coupled to the control electrode of the first bipolar transistor.

13. The electrostatic discharge (ESD) circuit of claim 12 further comprising:
    a fourth bipolar transistor coupled between the first power supply terminal and the data terminal wherein the fourth bipolar transistor comprises a control gate coupled to the first ground terminal.

14. The electrostatic discharge (ESD) circuit of claim 6 further comprising:
    a third bipolar transistor coupled to provide current between the data terminal and a second ground terminal of the integrated circuit, the third bipolar transistor comprising a control electrode coupled to the control electrode of the first bipolar transistor.

15. The electrostatic discharge (ESD) circuit of claim 6 further comprising:
    a fourth bipolar transistor coupled between the first power supply terminal and the data terminal wherein the fourth bipolar transistor comprises a control gate coupled to the first ground terminal.

16. The electrostatic discharge (ESD) circuit of claim 6 wherein the resistive element is coupled to both an input buffer circuit and an output buffer circuit such that the data terminal is a bidirectional data terminal, both the input buffer circuit and the output buffer circuit being coupled to a second power supply terminal of the integrated circuit which is electrically isolated from the first power supply terminal.

17. An electrostatic discharge (ESD) circuit for protecting an electrical circuit from damage, the electrostatic discharge (ESD) circuit comprising:
    a circuit node;
    a first bipolar transistor comprising a first current electrode, a second current electrode and a control electrode between the first current electrode and the second current electrode, the first current electrode being coupled to the circuit node and the second current electrode being coupled to a first ground conductor;
    a second bipolar transistor comprising a first current electrode, a second current electrode and a control electrode between the first current electrode and the second current electrode, the first current electrode being coupled to the circuit node and the second current electrode being coupled to a first power conductor, the control electrode of the first and second bipolar transistor being electrically coupled together to form a bipolar control node;
    a first field effect transistor comprising a first current electrode coupled to the first power conductor, a second current electrode coupled to the bipolar control node, a well tie coupled to the bipolar control node, and a gate electrode coupled to the circuit node; and
    an electrical device comprising a doped semiconductive region which is coupled to the bipolar control node and a gate electrode in close proximity to the doped semiconductive region which is coupled to the first ground conductor.

18. The electrostatic discharge (ESD) circuit of claim 17 further comprising:
    a resistive device coupled between the circuit node and at least one device internal to the electrical circuit.

19. The electrostatic discharge (ESD) circuit of claim 17 wherein the circuit node is coupled to an output driver circuit which provides an electrical signal to the circuit node.

20. The electrostatic discharge (ESD) circuit of claim 19 wherein circuit node is coupled to an input driver circuit which communicates an electrical signal from the circuit node.

21. The electrostatic discharge (ESD) circuit of claim 17 wherein circuit node is coupled to an input driver circuit which communicates an electrical signal from the circuit node.

22. The electrostatic discharge (ESD) circuit of claim 17 further comprising a second field effect transistor comprising a first current electrode coupled to a second ground conductor isolated from the first ground conductor, a second current electrode coupled to the bipolar control node, a well tie coupled to the bipolar control node, and a gate electrode coupled to the bipolar control node.

23. The electrostatic discharge (ESD) circuit of claim 22 further comprising a third bipolar transistor comprising a first current electrode, a second current electrode and a control electrode between the first current electrode and the second current electrode, the first current electrode being coupled to the circuit node, the control electrode being coupled to the bipolar control node, and the second current electrode being coupled to a second ground conductor.

24. The electrostatic discharge (ESD) circuit of claim 17 further comprising a fourth bipolar transistor comprising a first current electrode, a second current electrode and a control electrode between the first current electrode and the second current electrode, the first current electrode being coupled to the first power conductor, the control electrode being coupled to the first ground conductor, and the second current electrode being coupled to a circuit node.

25. The electrostatic discharge (ESD) circuit of claim 17 further comprising an output driver coupled to the circuit node wherein the output driver is supplied a supply voltage from a second power conductor electrically isolated from the first power conductor and from a second ground conductor isolated from the first ground conductor.

26. An electrostatic discharge (ESD) circuit comprising:
    a circuit node coupled to an external terminal of an integrated circuit;
    circuit means coupled between the circuit node and a VDD conductor;
    a first bipolar transistor comprising a first current electrode, a second current electrode and a control electrode between the first current electrode and the second current electrode, the first current electrode being coupled to the circuit node and the second current electrode being coupled to a first ground conductor;
    a second bipolar transistor comprising a first current electrode, a second current electrode and a control electrode between the first current electrode and the second current electrode, the first current electrode being coupled to the circuit node, the control electrode being coupled to the control electrode of the first bipolar transistor to form a bipolar control node, and the second current electrode being coupled to a second ground conductor which is isolated from the first ground conductor;
    a first field effect transistor comprising a first current electrode coupled to the second ground conductor, a second current electrode coupled to the bipolar control node, a well tie coupled to the bipolar control node, and a gate electrode coupled to the bipolar control node; and
    an electrical device comprising a doped semiconductive region which is coupled to the bipolar control node and a gate electrode in close proximity to the doped semiconductive region which is coupled to the first ground conductor.

27. An electrostatic discharge (ESD) circuit comprising:
    a circuit node for communicating an electrical signal;
    a bipolar transistor coupled to the circuit node; and
    an electrical device comprising a doped semiconductive region, a gate electrode, and a gate dielectric region separating the gate electrode from the doped semiconductive region, the doped semiconductive region being coupled to the bipolar transistor so that the electrical device functions as a trigger device which selectively turns on the bipolar transistor to limit a voltage level at the circuit node.

28. The electrostatic discharge (ESD) circuit of claim 27 wherein the bipolar transistor is turned on by the electrical device when a voltage applied to the doped semiconductive region of the electrical device surpasses a threshold voltage level resulting in the electrical device conducting a control current between the doped semiconductive region and a substrate.

* * * * *